(12) United States Patent
Noquil et al.

(10) Patent No.: US 12,176,274 B2
(45) Date of Patent: Dec. 24, 2024

(54) MULTI-DIE PACKAGE WITH MULTIPLE HEAT CHANNELS

(71) Applicant: TEXAS INSTRUMENTS INCORPORATED, Dallas, TX (US)

(72) Inventors: Jonathan Almeria Noquil, Plano, TX (US); Osvaldo Jorge Lopez, Annandale, NJ (US); Tianyi Luo, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/200,278

(22) Filed: Nov. 26, 2018

(65) Prior Publication Data

US 2020/0168533 A1    May 28, 2020

(51) Int. Cl.
*H01L 23/495* (2006.01)
*H01L 23/373* (2006.01)
*H01L 23/40* (2006.01)
*H01L 25/065* (2023.01)

(52) U.S. Cl.
CPC .... *H01L 23/49568* (2013.01); *H01L 23/3736* (2013.01); *H01L 23/4093* (2013.01); *H01L 23/49503* (2013.01); *H01L 23/49575* (2013.01); *H01L 25/0657* (2013.01)

(58) Field of Classification Search
None
See application file for complete search history.

(56) References Cited

U.S. PATENT DOCUMENTS

| | | | | |
|---|---|---|---|---|
| 7,304,372 B2 * | 12/2007 | Hu | ............... | H01L 25/18 257/E23.079 |
| 7,615,854 B2 * | 11/2009 | Montgomery | ......... | H01L 24/84 257/691 |
| 8,278,747 B2 * | 10/2012 | Mamitsu | ............... | H01L 23/473 257/690 |
| 8,723,311 B2 * | 5/2014 | Stella | ............... | H01L 23/49575 257/706 |
| 9,214,415 B2 * | 12/2015 | Denison | ............... | H01L 25/072 |
| 9,437,587 B2 * | 9/2016 | Zhang | ............... | H01L 24/73 |
| 9,524,957 B2 * | 12/2016 | Hebert | ............. | H01L 23/49541 |
| 10,027,094 B2 * | 7/2018 | Baeumel | ......... | H01L 23/49537 |
| 2004/0080028 A1 * | 4/2004 | Yanagisawa | ............ | H01L 24/40 257/676 |
| 2008/0203550 A1 * | 8/2008 | Ewe | ............... | H01L 23/4334 438/122 |
| 2010/0133670 A1 * | 6/2010 | Liu | ............... | H01L 23/49524 438/122 |
| 2010/0133674 A1 * | 6/2010 | Hebert | ............. | H01L 23/49575 438/109 |
| 2010/0148327 A1 * | 6/2010 | Madrid | ............... | H01L 24/16 257/670 |

(Continued)

*Primary Examiner* — Nishath Yasmeen
(74) *Attorney, Agent, or Firm* — Dawn Jos; Frank D. Cimino

(57) ABSTRACT

A semiconductor package comprises a first die thermally coupled to a first thermally conductive device. The first thermally conductive device has a first surface exposed to an exterior of the semiconductor package. The package comprises a second die thermally coupled to a second thermally conductive device, the second thermally conductive device having a second surface exposed to an exterior of the semiconductor package. The first and second dies are positioned in different horizontal planes.

17 Claims, 9 Drawing Sheets

(56) References Cited

U.S. PATENT DOCUMENTS

| | | | | |
|---|---|---|---|---|
| 2010/0171543 A1* | 7/2010 | Korec | ............... | H01L 24/49 |
| | | | | 257/E29.345 |
| 2011/0096509 A1* | 4/2011 | Yoshimochi | ...... | H01L 23/49537 |
| | | | | 361/728 |
| 2011/0140262 A1* | 6/2011 | Lee | ............... | H01L 23/4334 |
| | | | | 257/E23.101 |
| 2012/0098090 A1* | 4/2012 | Hebert | ............... | H01L 24/37 |
| | | | | 257/532 |
| 2013/0285260 A1* | 10/2013 | Denison | ............ | H01L 23/49575 |
| | | | | 257/777 |
| 2015/0214139 A1* | 7/2015 | Miyakawa | ............... | H01L 24/41 |
| | | | | 257/675 |
| 2015/0221584 A1* | 8/2015 | Lopez | ............... | H01L 23/49541 |
| | | | | 257/676 |
| 2016/0005675 A1* | 1/2016 | Tong | ............ | H01L 23/3672 |
| | | | | 438/122 |
| 2018/0240731 A1* | 8/2018 | Choi | ............ | H01L 23/4334 |

\* cited by examiner

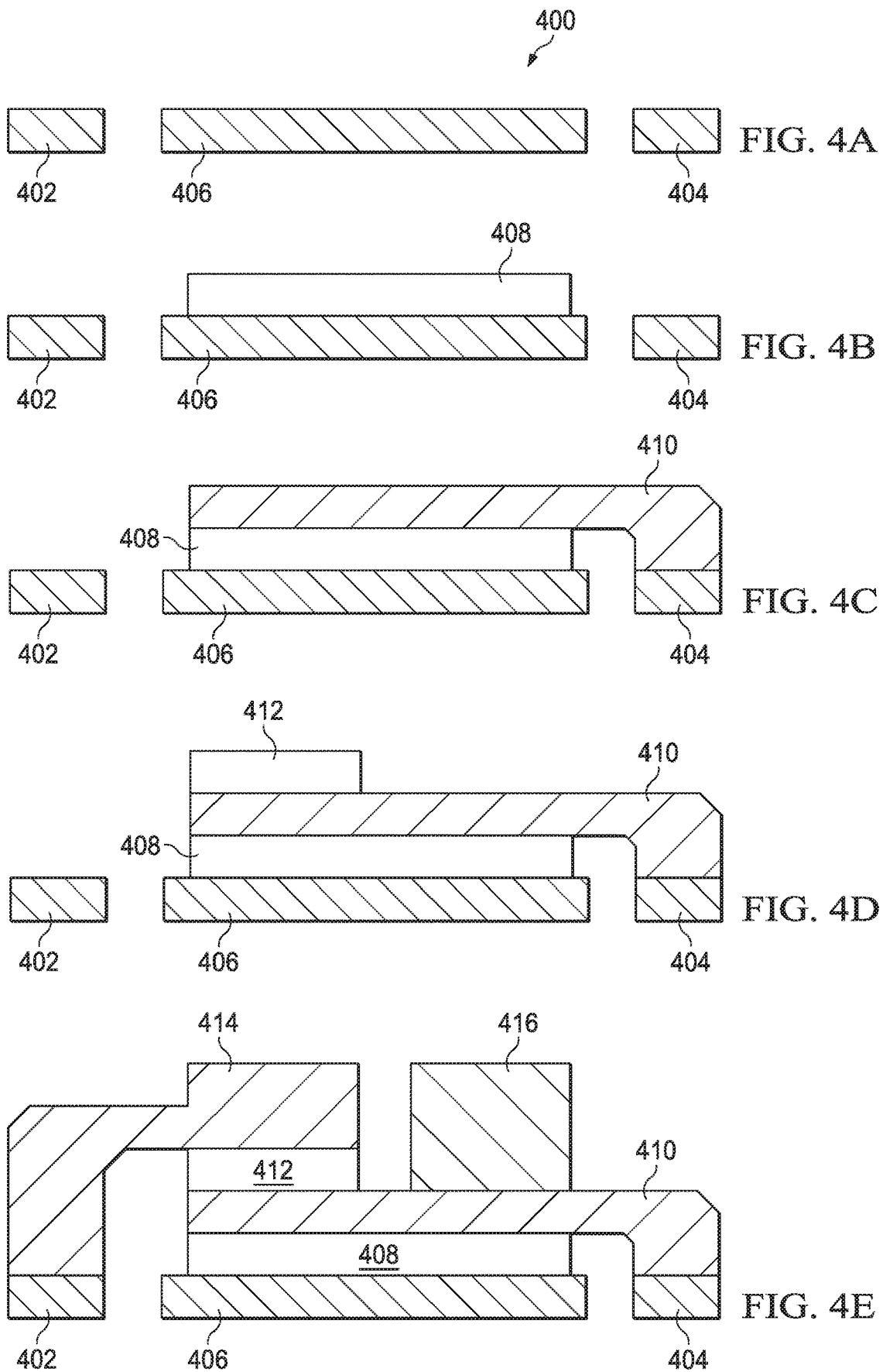

MULTI-DIE PACKAGE WITH MULTIPLE HEAT CHANNELS

SUMMARY

In an example, a semiconductor package comprises a first die thermally coupled to a first thermally conductive device. The first thermally conductive device has a first surface exposed to an exterior of the semiconductor package. The package comprises a second die thermally coupled to a second thermally conductive device, the second thermally conductive device having a second surface exposed to an exterior of the semiconductor package. The first and second dies are positioned in different horizontal planes.

In an example, a semiconductor package comprises a lead frame comprising a first lead, a second lead, and a die pad. The package includes a first die positioned on the die pad, and a first thermally conductive device coupling the first die to the first lead. The first thermally conductive device has a first surface that is approximately flush with a surface of the semiconductor package. A second die is positioned on the first thermally conductive device. A second thermally conductive device couples the second die to the second lead, the second thermally conductive device having a second surface that is approximately flush with the surface of the semiconductor package. The first and second dies are situated in different horizontal planes.

In an example, a method of fabricating a semiconductor package comprises providing a lead frame having a die pad, a first lead, and a second lead. The method comprises coupling a first die to the die pad, coupling a first thermally conductive device to the first die and to the first lead, coupling a second die to the first thermally conductive device, the first and second dies in different horizontal planes, coupling a second thermally conductive device to the second die and to the second lead, causing a first surface of the first thermally conductive device to be approximately flush with a surface of the semiconductor package, and causing a second surface of the second thermally conductive device to be approximately flush with the surface of the semiconductor package.

BRIEF DESCRIPTION OF THE DRAWINGS

For a detailed description of various examples, reference will now be made to the accompanying drawings in which:

FIGS. 4A-4H depict an assembly flow for an example multi-die package with multiple heat channels.

DETAILED DESCRIPTION

During manufacture, semiconductor chips (also commonly referred to as "dies") are typically mounted on die pads of lead frames and are wire-bonded, clipped, or otherwise coupled to leads of the lead frame. The entire assembly is later encapsulated in a mold compound, such as epoxy, to protect the assembly from potentially damaging heat, physical trauma, and other deleterious factors. The finished, encapsulated assembly is called a semiconductor package or, more simply, a package.

Some packages contain multiple dies. These dies may share space on a single die pad, meaning that the dies share a common horizontal plane. In other packages, the dies are in different horizontal planes. For example, in some packages, one die may be stacked on top of another. In these packages, the dies may be abutting each other, or there may be intervening components, such as die attach clips, that are positioned between the dies.

Dies generate heat. To protect the integrity of the package and its contents, this heat should be dissipated away from the die and out of the package. Dissipating heat can be particularly challenging in multi-die packages due to the numerous components and crowded conditions that can exist inside such packages. This is particularly true for multi-die packages with stacked die configurations. In such packages, the upper dies can dissipate heat more easily than the dies that are situated toward the bottom of the package. For these bottom-level dies, heat cannot dissipate efficiently because there are numerous components blocking the path between the dies and the top of the package, thus making it difficult for heat to be transferred to the top and out of the package.

Described herein are various examples of multi-die packages with multiple heat channels, which solve the problems of inefficient and ineffective heat dissipation as described above. In an example, a semiconductor package comprises a first die thermally coupled to a first thermally conductive device, where the first thermally conductive device has a first surface exposed to an exterior of the semiconductor package. The package also comprises a second die thermally coupled to a second thermally conductive device, where the second thermally conductive device has a second surface exposed to an exterior of the semiconductor package. The first and second dies are positioned in different horizontal planes. Various examples of such packages, as well as methods for their manufacture, are now described with respect to the drawings.

Figure 1:
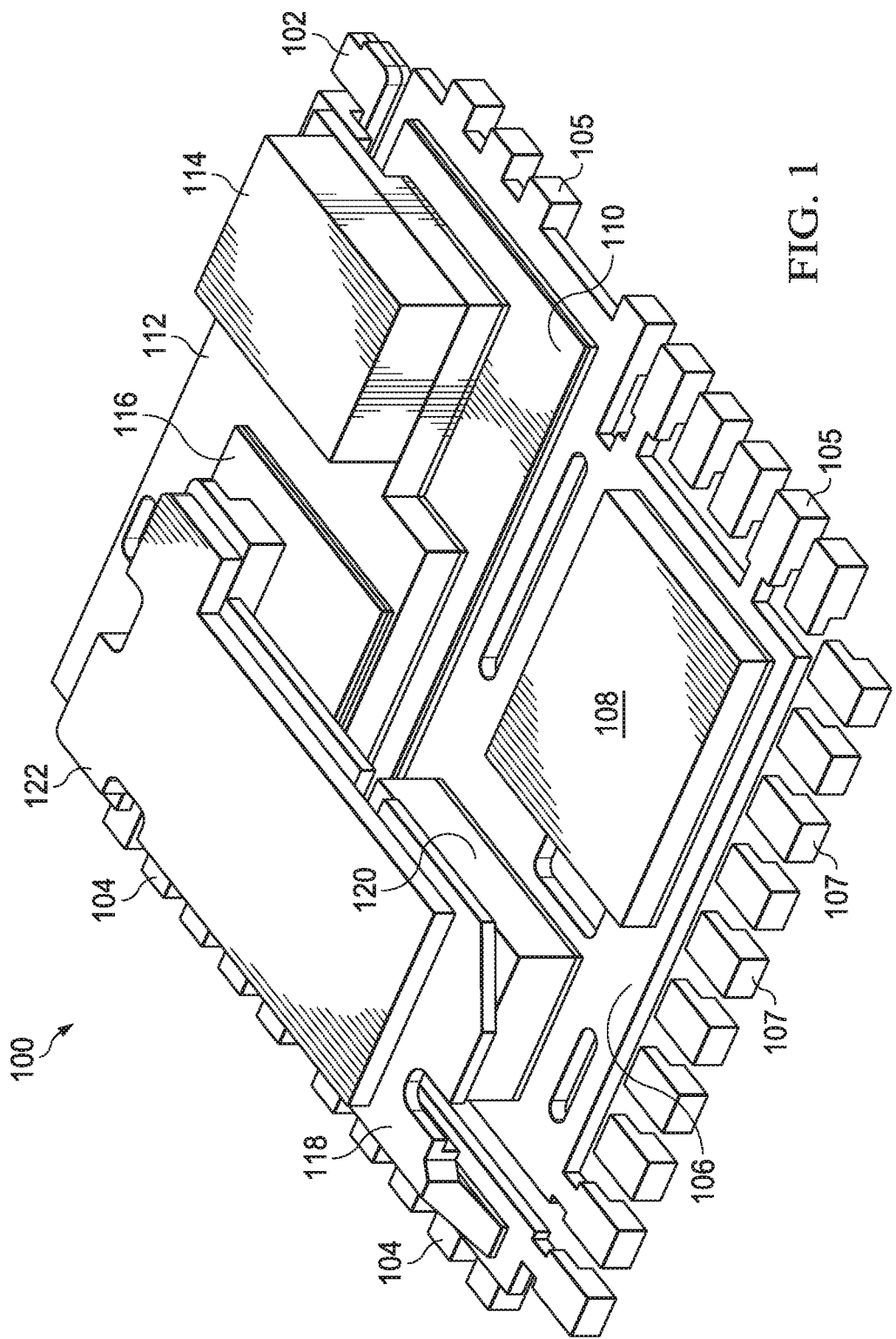
FIG. 1 depicts a perspective view of an example multi-die package with multiple heat channels.

FIG. 1 depicts a perspective view of an example multi-die package 100 with multiple heat channels. The example package 100 is merely illustrative of packages with multiple heat channels. In practice, a virtually unlimited number of intra-package configurations are possible such that multiple heat channels are formed, and any and all such configurations are contemplated and included within the scope of this disclosure.

The package 100 comprises multiple leads of a lead frame. More specifically, the package 100 includes four groups of leads: a first group of leads 102, a second group of leads 104, a third group of leads 105, and a fourth group of leads 107. In addition, the package 100 includes a die pad 106. The specific configuration of the leads 102, 104, 105, and 107 and the die pad 106 is merely illustrative, and all variations and permutations of such configurations are contemplated and included within the scope of this disclosure.

The package 100 further includes a controller die 108 (usable to, e.g., control other dies in the package 100), a die 110, a die attach clip 112, a heat slug 114, a die 116, a die attach clip 118, an electronic component 120, and a heat slug 122. Wirebonds between the dies and/or leads are omitted to preserve the clarity of the drawing. The die attach clip 112 and heat slug 114 are shown as distinct components in FIG.

1. In some examples, the die attach clip 112 and heat slug 114 are attached to each other using, e.g., solder. In some examples, the die attach clip 112 and heat slug 114 are welded together, for example, prior to assembly of the package 100. In some examples, the die attach clip 112 and heat slug 114 are monolithic, meaning that they are composed of the same material, are formed during the same manufacturing process, and are a single unit, as opposed to being two individual components that are connected together. The foregoing description of the relationship between the die attach clip 112 and heat slug 114 also applies to the die attach clip 118 and the heat slug 122. With such examples, the die attach clip and heat slug are collectively referred to as thermally conductive devices. In some examples, the die attach clip 112, the heat slug 114, and/or the combination thereof in the form of a thermally conductive device comprise(s) copper.

The electronic component 120 is representative of any suitable electronic component, such as a capacitor or an inductor. It is depicted in FIG. 1 merely to show one example in which electronic components besides dies are included. The electronic component 120 is not essential to multi-die packages with multiple heat channels.

In operation, the dies 110, 116 generate heat. The dies 110, 116 are positioned in different horizontal planes, meaning that the die 116 is located closer to the top of the package 100 than the die 110. In addition, the dies 110, 116 are in a stacked die configuration, meaning that there is at least some overlap between the vertical planes occupied by these two dies. Thus, heat may escape more efficiently from the die 116 than from the die 110. As a result, the die 110 could become overheated. Unlike other technologies that have only one path (or heat channel) via which heat may escape, the package 100 includes multiple paths (or heat channels). Specifically, the die attach clip 118 and heat slug 122, which together form a thermally conductive device, provide a heat channel via which heat may escape from the die 116 and may flow through the top of the package to an area outside of the package. Similarly, the die attach clip 112 and the heat slug 114, which together form another thermally conductive device, provide another heat channel via which heat may escape from the die 110 and may flow through the top of the package to an area outside of the package. (To aid in heat dissipation, both of the heat slugs 122, 114 are exposed to an exterior of the package 100, as shown in other drawings and as described further below.) It is also possible for heat to dissipate from the die 110 via the die attach clip 112, die 116, die attach clip 118, and heat slug 122. However, this path is less efficient, which is why the heat channel formed by the die attach clip 112 and heat slug 114 is particularly useful in efficiently cooling the die 110.

The term "thermally coupled" may be used in this disclosure. This term refers to two or more components between which heat may be transferred, whether directly or indirectly. For example, the die 110 is thermally coupled to the die attach clip 112, meaning that heat is transferable between the die 110 and the die attach clip 112. Similarly, the die 110 is thermally coupled to the heat slug 114, meaning that heat is transferable between the die 110 and the heat slug 114 (via the die attach clip 112).

Figure 2A:
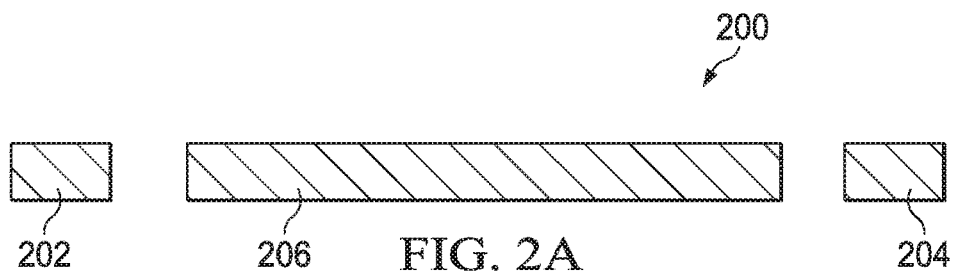
FIGS. 2A-2G depict an assembly flow for an example multi-die package with multiple heat channels.
Figure 2B:
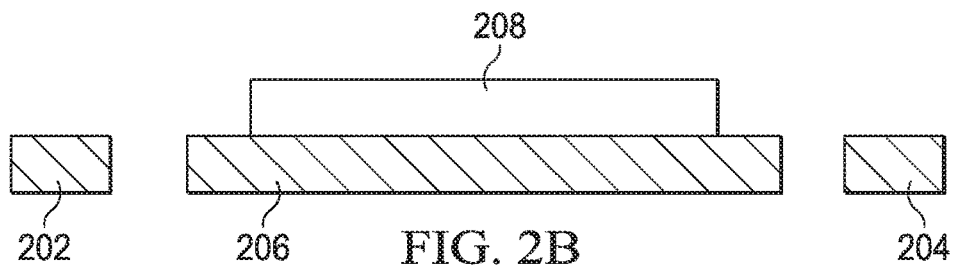
Figure 2C:
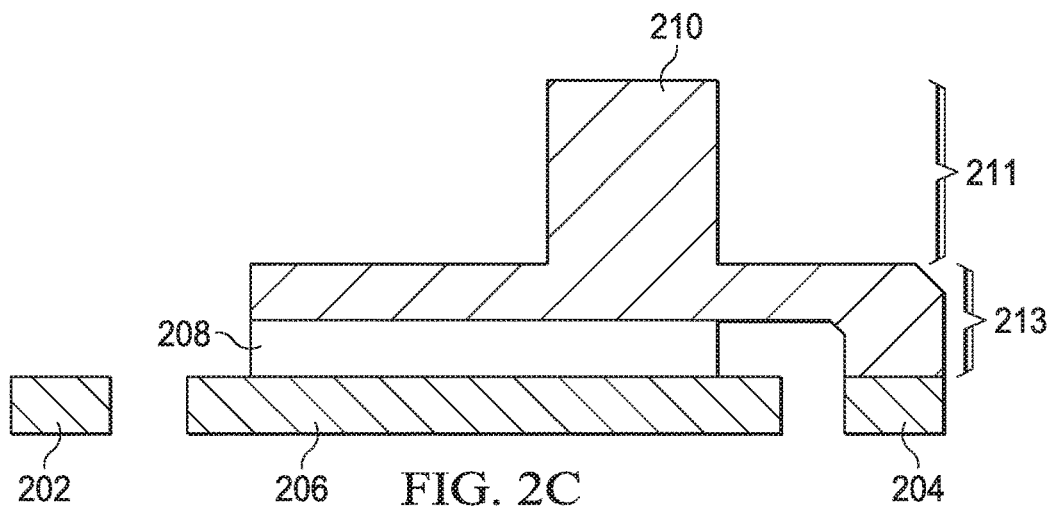
Figure 2D:
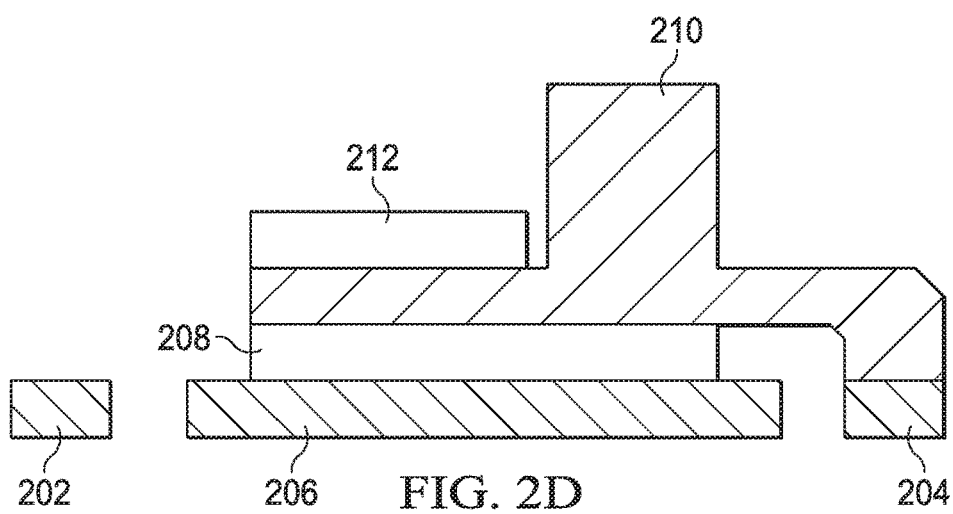
Figure 2E:
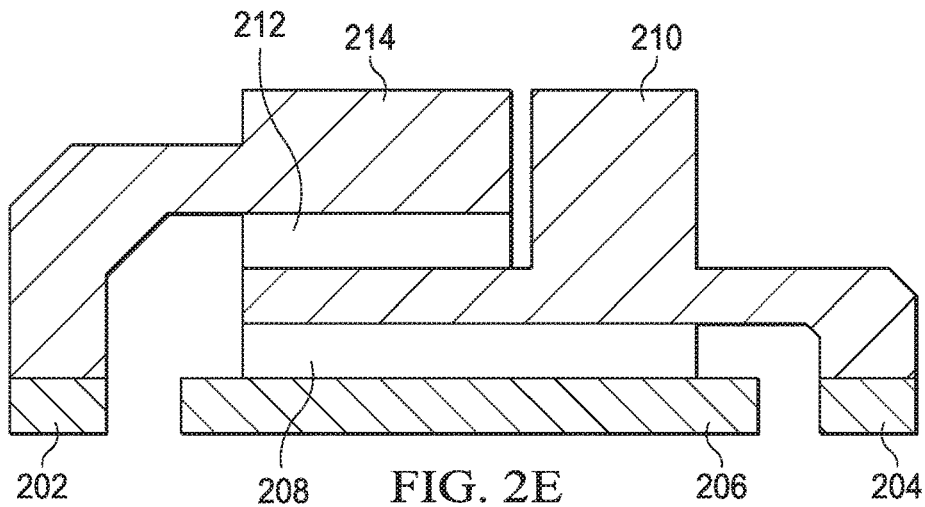
Figure 2F:
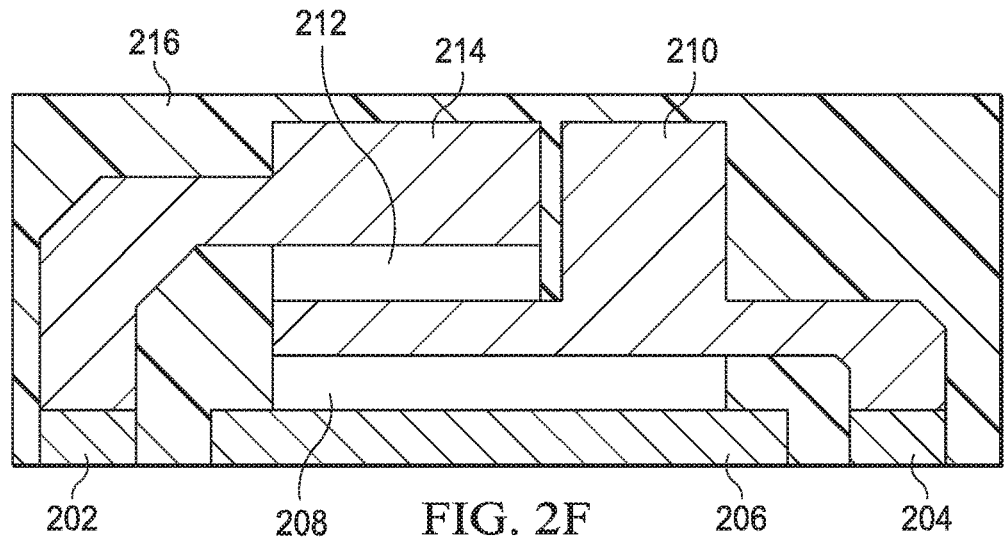
Figure 2G:
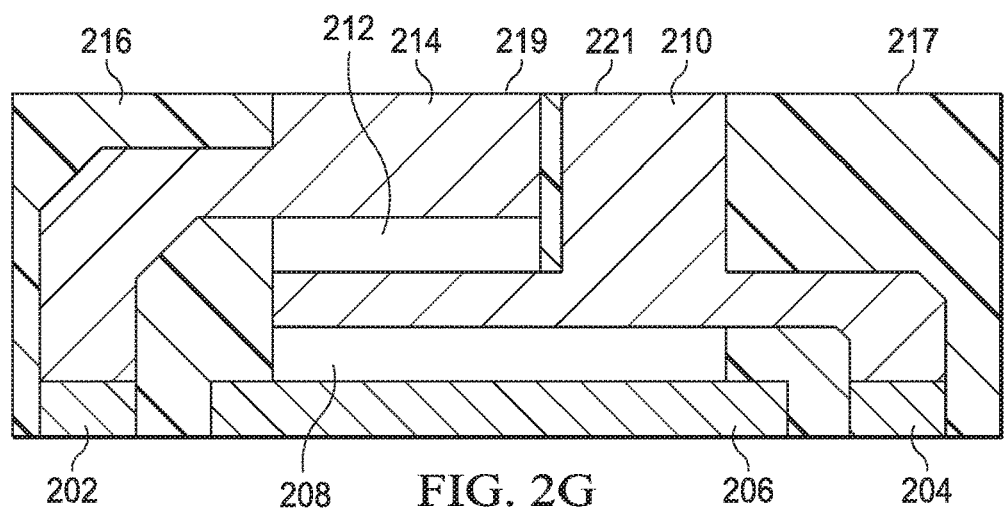
Figure 3:
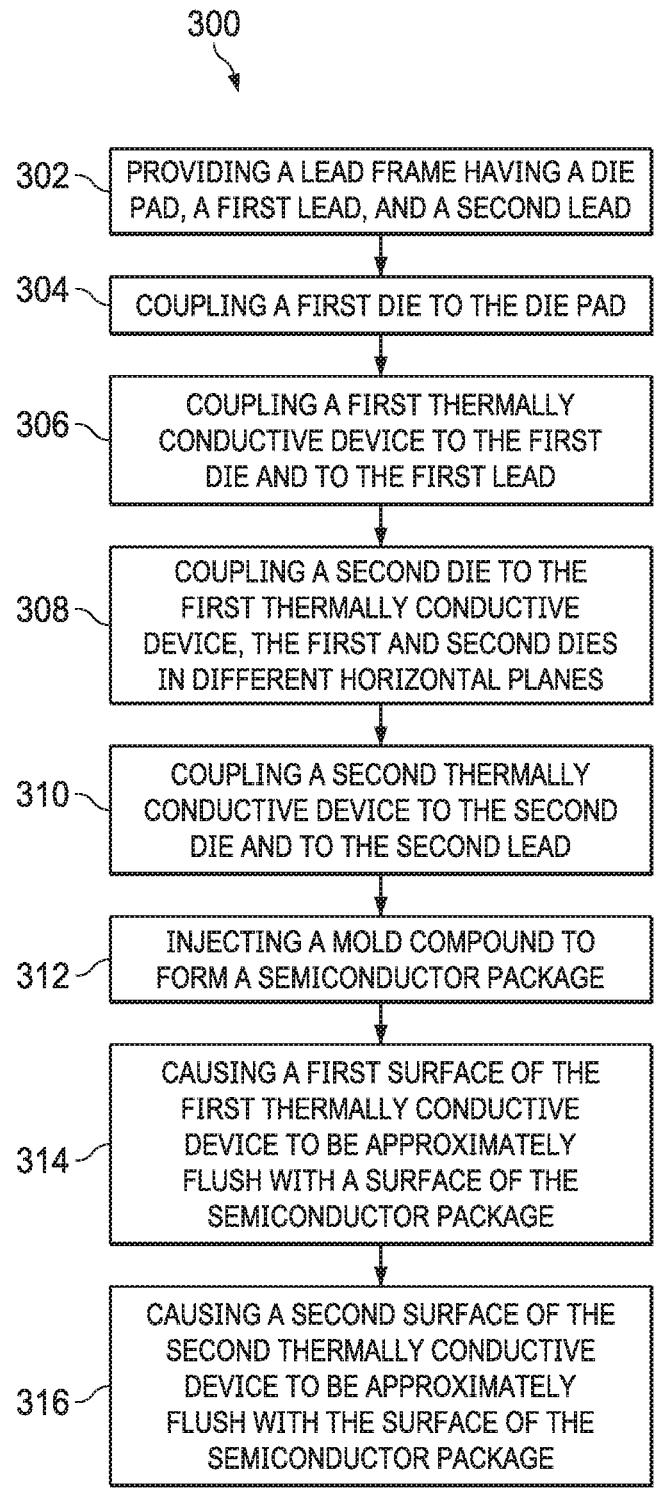
FIG. 3 depicts a flow diagram of a method corresponding to the assembly flow of FIGS. 2A-2G, in accordance with various examples.

FIGS. 2A-2G depict an assembly flow for an example multi-die package with multiple heat channels. FIG. 3 depicts a flow diagram of a method corresponding to the assembly flow of FIGS. 2A-2G, in accordance with various examples. Accordingly, FIGS. 2A-2G and FIG. 3 are now described in tandem. The method 300 of FIG. 3 begins by providing a lead frame having a die pad, a first lead, and a second lead (step 302). As FIG. 2A depicts, a lead frame 200 comprises a die pad 206 with leads 202 and 204. Because FIGS. 2A-2G provide a side view, not all leads are visible in this view.

The method 300 continues by coupling a first die to the die pad (step 304). As FIG. 2B depicts, a die 208 is coupled to the die pad 206. In some examples, solder is used to couple the die 208 to the die pad 206. The method 300 next includes coupling a first thermally conductive device to the first die and to the first lead (step 306). As FIG. 2C depicts, a thermally conductive device 210 is thermally coupled to the die 208 and to the lead 204. Solder may be used to perform this coupling. The thermally conductive device 210 is similar to the thermally conductive devices described above with respect to FIG. 1. For example, the thermally conductive device 210 may be a monolithic device. In an example, the thermally conductive device 210 includes a heat slug 211 thermally coupled to a die attach clip 213, whether by welding, soldering, or another technique.

The method 300 next includes coupling a second die to the first thermally conductive device, where the first and second dies are in different horizontal planes (step 308). As FIG. 2D depicts, a die 212 is thermally coupled to the thermally conductive device 210, for example, using solder. The method 300 further comprises coupling a second thermally conductive device to the second die and to the second lead (step 310). As FIG. 2E depicts, a thermally conductive device 214 is thermally coupled to the die 212 and to the lead 202 (e.g., using solder). As described above with respect to other thermally conductive devices, the thermally conductive device 214 may be monolithic or may be composed of a heat slug and a die attach clip coupled together by welding, soldering, or some other suitable technique.

The method 300 next includes injecting mold compound (e.g., epoxy) to form a semiconductor package (step 312). (Prior to step 312, other suitable steps may be performed, such as a solder reflow process to strengthen the thermal couplings of the various components shown in FIG. 2E.) As FIG. 2F depicts, a mold compound 216 is formed around and inside the assembly, thus forming a package. The method 300 then comprises causing a first surface of the first thermally conductive device to be approximately flush with a surface of the semiconductor package (step 314). Similarly, the method 300 comprises causing a second surface of the second thermally conductive device to be approximately flush with the surface of the semiconductor package (step 316). As FIG. 2G depicts, the top surface 217 of the mold compound 216 is trimmed (e.g., by grinding or another suitable process) so that the top surface 217 is approximately flush with the top surfaces 219, 221 of the thermally conductive devices 210, 214. (By "approximately flush," it is meant that each of the top surfaces 219, 221 is within plus or minus 5 millimeters of the top surface 217.) In some examples, the top surface 217 is not approximately flush with one or both of the top surfaces 219, 221. In such examples, heat dissipation is still achieved, so long as the top surfaces 219, 221 are still exposed to an exterior of the package. As shown, the dies 208, 212 are stacked dies in different horizontal planes.

Figure 4F:
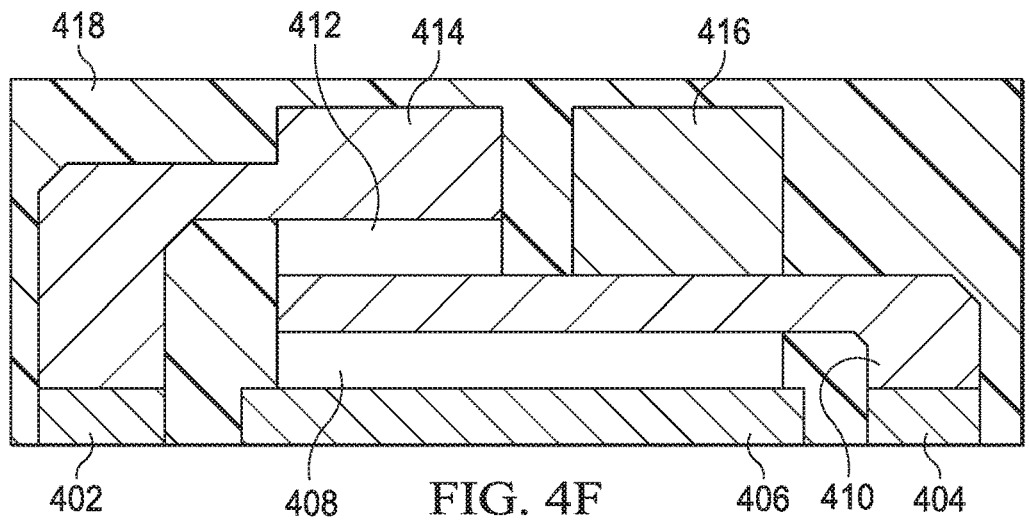
Figure 4G:
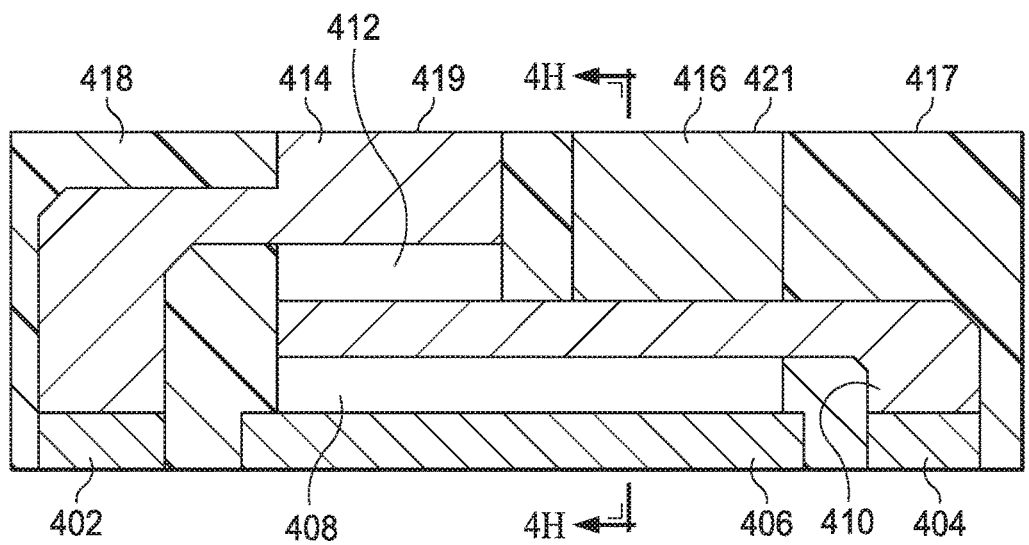
Figure 4H:
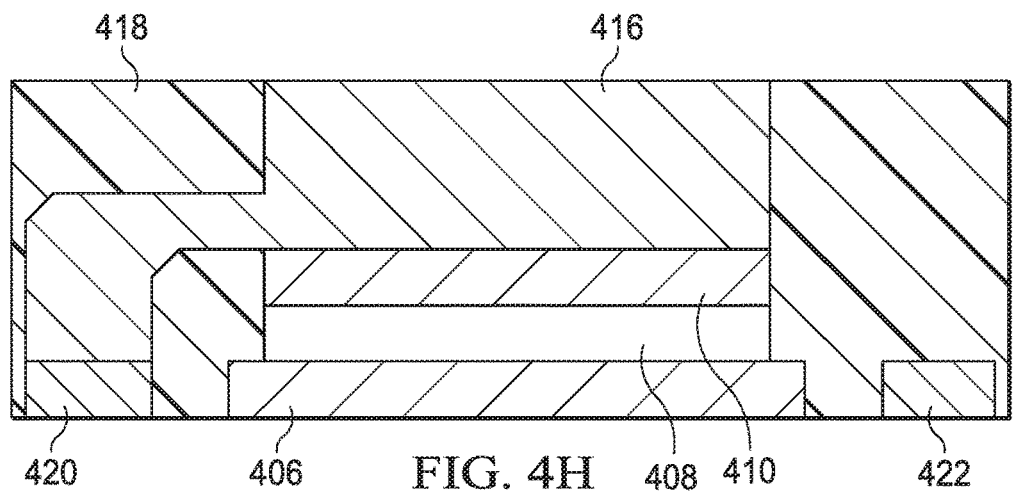
Figure 5:
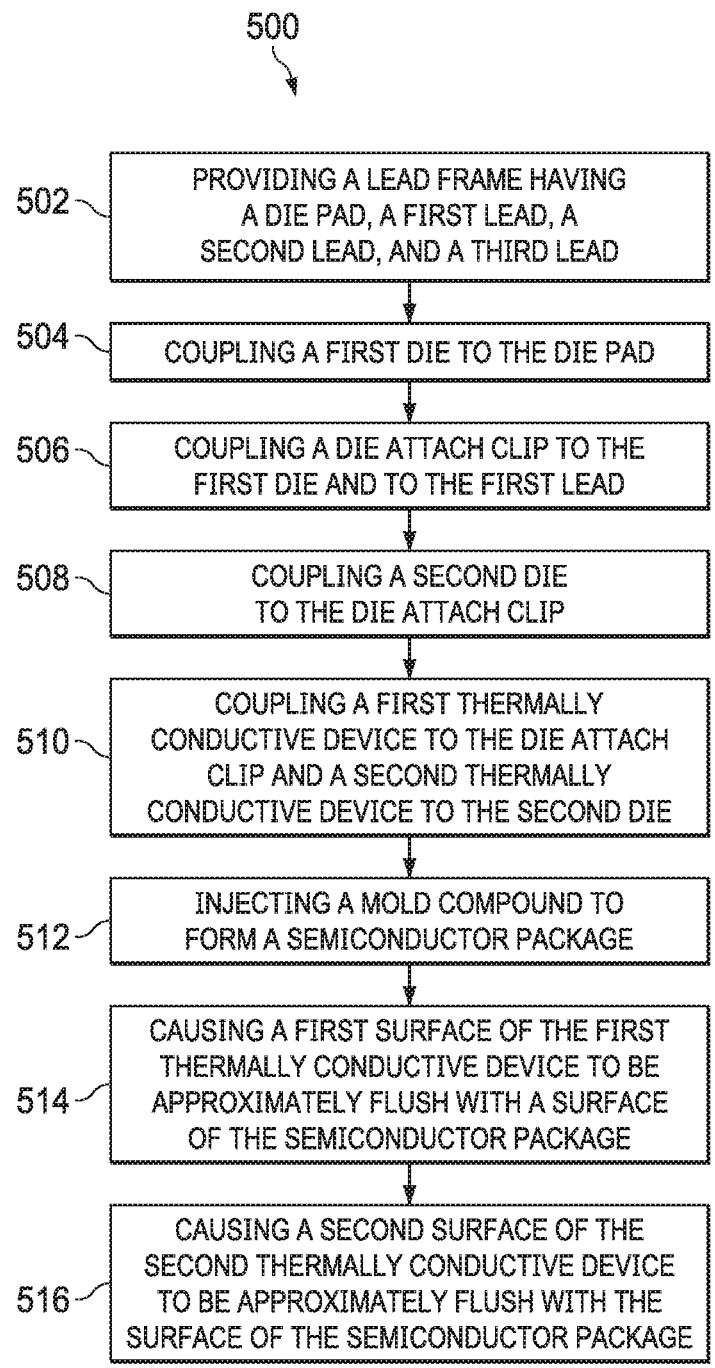
FIG. 5 depicts a flow diagram of a method corresponding to the assembly flow of FIGS. 4A-4H, in accordance with various examples.

The completed package as depicted in FIG. 2G includes the thermally conductive device 210 coupled directly to the die 208. In some examples, a thermally conductive device can couple indirectly to a die, such as via a die attach clip. The fabrication of such a package is now described. FIGS. 4A-4H depict an assembly flow for an example multi-die package with multiple heat channels. FIG. 5 depicts a flow diagram of a method corresponding to the assembly flow of FIGS. 4A-4H, in accordance with various examples. Thus, FIGS. 4A-4H and 5 are now described in tandem. The method 500 of FIG. 5 begins by providing a lead frame having a die pad, a first lead, a second lead, and a third lead (step 502). As FIG. 4A depicts, a lead frame 400 includes a die pad 406 and leads 402, 404. The remaining leads of the lead frame 400 are not visible in FIG. 4A, as FIG. 4A is a side view. The method 500 then comprises coupling a first die to the die pad (step 504). As FIG. 4B depicts, a die 408 is thermally coupled to the die pad 406, such as via a soldering process. The method 500 subsequently includes coupling a die attach clip to the first die and to the first lead (step 506). As FIG. 4C depicts, a die attach clip 410 electrically couples to the die 408 and to the lead 404, for example using solder.

The method 500 still further includes coupling a second die to the die attach clip (step 508). As FIG. 4D depicts, a die 412 couples to the die attach clip 410, for example, using solder. The method 500 next comprises coupling a first thermally conductive device to the die attach clip and a second thermally conductive device to the second die (step 510). In some examples, the first and second thermally conductive devices are installed simultaneously. In some examples, the first and second thermally conductive devices are installed one after another. As FIG. 4E depicts, a thermally conductive device 414 thermally couples to the die 412 (e.g., using solder) and couples to the lead 402. As FIG. 4E also depicts, a thermally conductive device 416 thermally couples to the die attach clip 410 (e.g., using solder) and couples to a lead that is not visible in the side view of FIG. 4E. Specifically, the thermally conductive device 416 extends "outward" from the page. FIG. 4H, described later below, provides an alternate view to better depict the thermally conductive device 416.

The method 500 then comprises injecting a mold compound to form a semiconductor package (step 512). FIG. 4F depicts the assembly including mold compound 418 (e.g., epoxy). The method 500 includes causing a first surface of the first thermally conductive device to be approximately flush with a surface of the semiconductor package (step 514) and causing a second surface of the second thermally conductive device to be approximately flush with the surface of the semiconductor package (step 516). As FIG. 4G depicts, the top surface 417 of the mold compound 418 is trimmed (e.g., by grinding or another suitable process) so that the top surface 417 is approximately flush with the top surfaces 419, 421 of the thermally conductive devices 414, 416. (By "approximately flush," it is meant that each of the top surfaces 419, 421 is within plus or minus 5 millimeters of the top surface 417.) In some examples, the top surface 417 is not approximately flush with one or both of the top surfaces 419, 421. In such examples, heat dissipation is still achieved, so long as the top surfaces 419, 421 are still exposed to an exterior of the package. As shown, the dies 408, 412 are stacked dies in different horizontal planes.

FIG. 4H depicts a cross-sectional side view of the package of FIG. 4G as marked by "4H" in FIG. 4G. The view of FIG. 4H more clearly illustrates the structure of the thermally conductive device 416. As shown, the thermally conductive device 416 thermally couples to the die 410 (e.g., using solder) and to the lead 420 (e.g., using solder), which is the third lead mentioned in step 502 of FIG. 5. A lead 422 is also depicted. As with the other thermally conductive devices described herein, the thermally conductive device 416 can be a monolithic device, or it can be composed of a heat slug that is connected to a die attach clip using a welding process, a soldering process, or any other suitable process for thermally coupling two metals.

Figure 6:
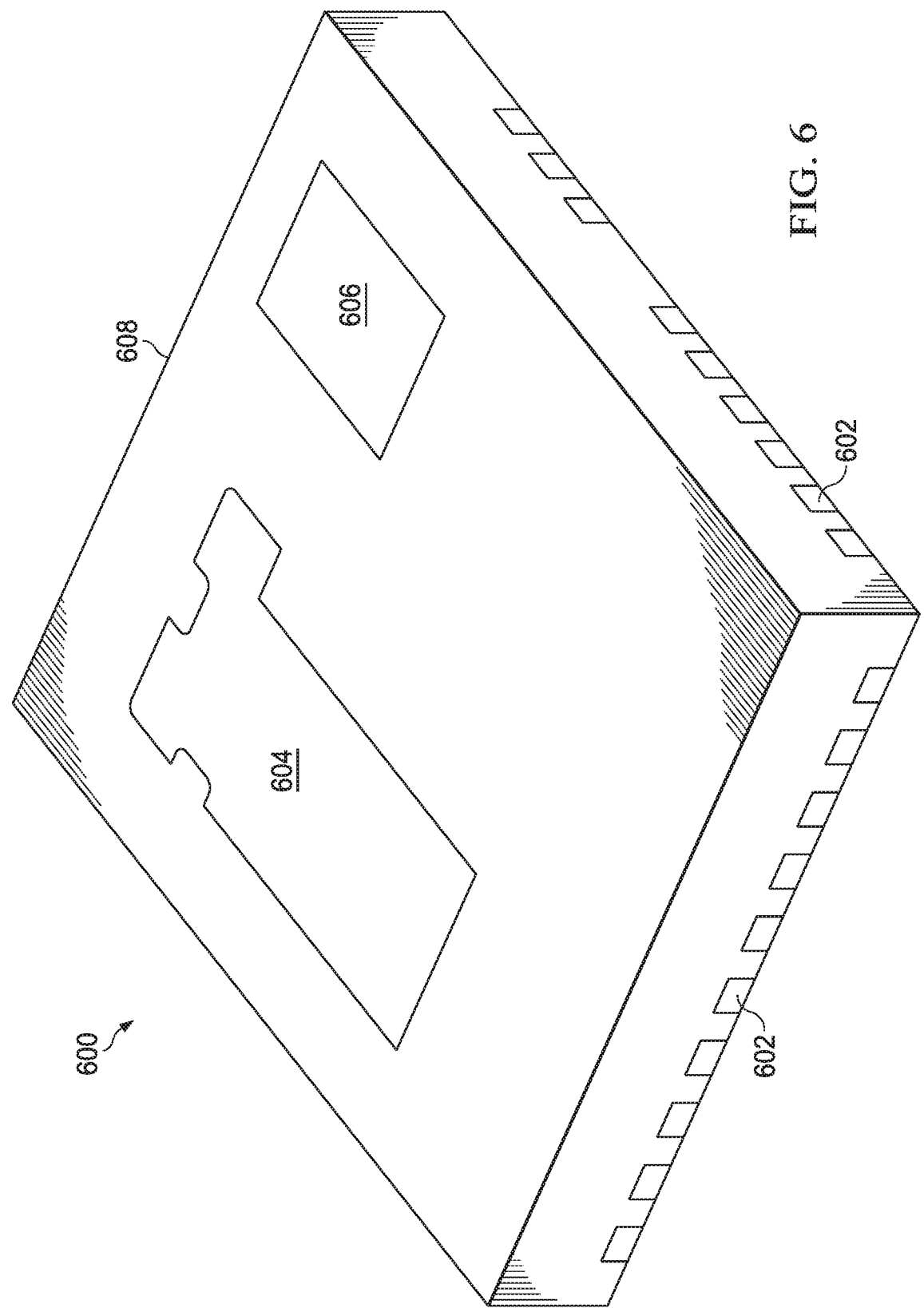
FIG. 6 depicts a perspective view of an exterior of a multi-die package with multiple heat channels, in accordance with various examples.

FIG. 6 depicts a perspective view of an exterior of a multi-die package 600 with multiple heat channels, in accordance with various examples. As shown, the package 600 comprises multiple leads 602 via which circuitry (e.g., multiple dies) within the package 600 may be electrically accessed. A thermally conductive device 604 and a thermally conductive device 606 are exposed to an exterior of the package 600. In the example depicted in FIG. 6, the top surfaces of the thermally conductive devices 604, 606 are approximately flush with a top surface 608 of a mold compound. However, as explained above, such a flush relationship is not necessary, so long as the top surfaces of the thermally conductive devices 604, 606 are exposed to an exterior of the package to provide for heat dissipation.

The foregoing description and drawings provide examples of multi-die packages with multiple heat channels. These are merely representative. The principles embodied therein can be extended to a virtually unlimited number of package configurations, with virtually any number of dies and/or heat channels arranged in any suitable configuration. All such configurations are included in the scope of this disclosure.

Figure 7:
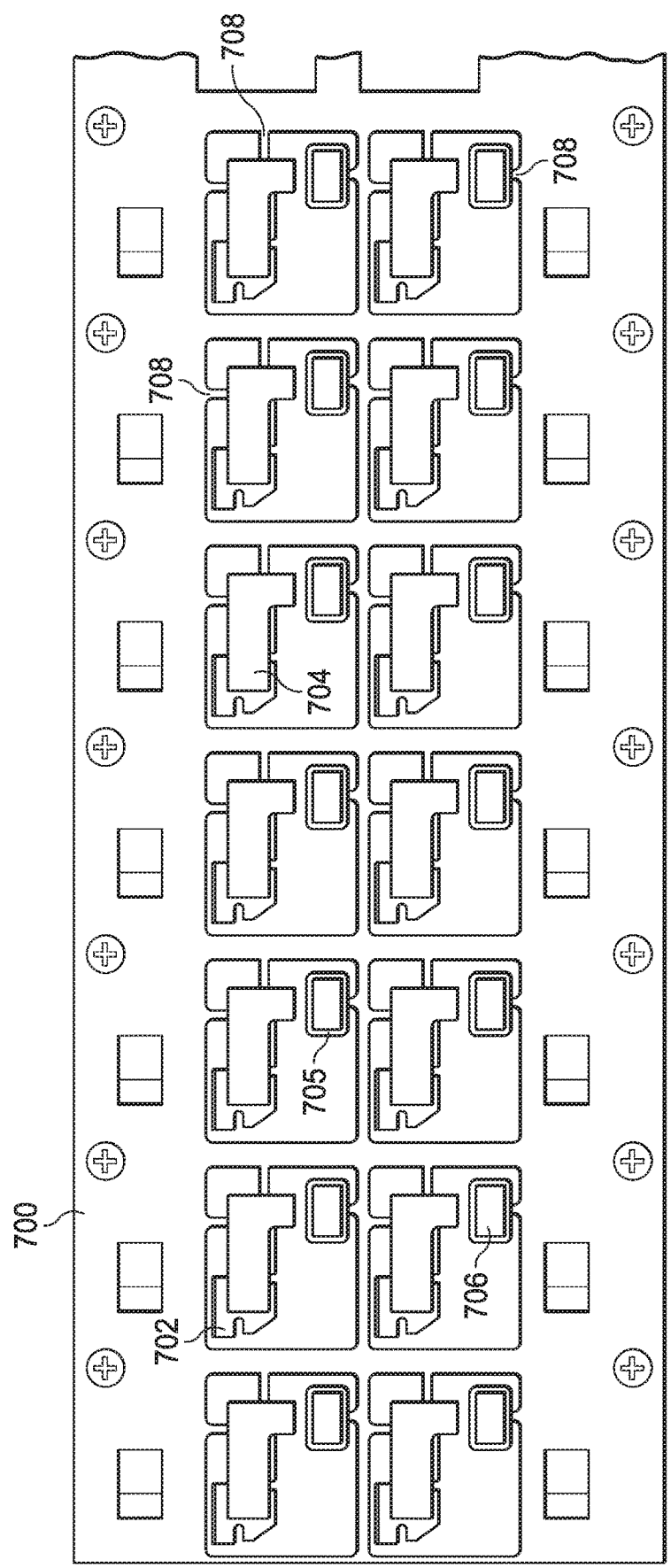
FIG. 7 depicts a lead frame strip comprising thermally conductive devices that include die attach clips and heat slugs coupled together or in monolithic form, in accordance with various examples.

The thermally conductive devices described herein can be formed in any of a variety of ways. In some examples, the thermally conductive devices are formed on a lead frame strip (or "reel"), from which the thermally conductive devices may readily be singulated and placed into the package during package assembly. FIG. 7 depicts a lead frame strip 700 comprising thermally conductive devices such as those described above. In the particular example of FIG. 7, two thermally conductive devices are provided in each frame of the lead frame strip 700. Numeral 702 refers to a die attach clip and numeral 704 refers to a heat slug, both of which together form one of the two thermally conductive devices of a single frame of the lead frame strip 700. As explained above, the die attach clip 702 and the heat slug 704 may be formed separately and welded or soldered together. As explained above, the die attach clip 702 and heat slug 704 may be monolithic. The thermally conductive device formed by the die attach clip 702 and heat slug 704 are physically connected to the lead frame strip 700 via tie bars 708. The other thermally conductive device formed in each frame of the lead frame strip 700 includes a die attach clip 705 and a heat slug 706. As explained above, the die attach clip 705 and heat slug 706 can be monolithic or formed separately and coupled together using, e.g., a welding or soldering process. The thermally conductive device formed by the die attach clip 705 and heat slug 706 physically connect to the lead frame strip 700 via a tie bars 708.

During assembly of a multi-die package with multiple heat channels, the thermally conductive devices are detached from the lead frame strip 700 by singulating along the tie bars 708 and then positioned within the package as described in the various examples above. The specific physical dimensions of the thermally conductive devices are widely variable (particularly in length and width), although in some examples, the thermally conductive devices depicted in any or all of the drawings are approximately 0.25 millimeters in vertical thickness. In some examples, the heat slug portions of the thermally conductive devices are approximately 0.25 millimeters in vertical thickness. In some examples, the die attach clip portions of the thermally conductive devices are approximately 0.25 millimeters in vertical thickness. In some examples, the thermally conductive devices are homogenously made of a single material, such as copper or any suitable conductive material. In some examples, the die attach clip is made of a different material than the heat slug. For instance, the die attach clip may be composed of copper, and the heat slug may be composed of aluminum or copper.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor package, comprising:
a die attach pad, a first lead, and a second lead;
a first die attached to the die attach pad;
a first die attach clip attached to the first die and to the first lead;
a first heat slug, extending from the first die attach clip, with a portion of the first heat slug exposed on an exterior surface of the semiconductor package;
a second die directly attached to the first die attach clip;
a second die attach clip attached to the second die and to the second lead; and
a second heat slug attached to the second die attach clip, the second heat slug extending from the second die attach clip, with a portion of the second heat slug exposed on the exterior surface; wherein the second die is completely above the first die from a cross-sectional view of the semiconductor package, wherein a cross-sectional length of the second die completely aligns with a cross-sectional length of the first die in a vertical direction, the vertical direction perpendicular to a plane along the exterior surface, and wherein the exterior surface of the semiconductor package is at a top in the cross-sectional view of the semiconductor package.

2. The semiconductor package of claim 1, wherein the first heat slug and the first die attach clip are welded together.

3. The semiconductor package of claim 2, wherein the second heat slug and the second die attach clip are welded together.

4. The semiconductor package of claim 2, wherein the first heat slug and the first die attach clip are monolithic.

5. The semiconductor package of claim 1, wherein the first heat slug or the second heat slug has a vertical thickness of approximately 0.25 millimeters.

6. The semiconductor package of claim 1, wherein the first heat slug, the second heat slug, the first die attach clip, and the second die attach clip are of a same material.

7. The semiconductor package of claim 1, wherein the first and second dies are stacked dies.

8. The semiconductor package of claim 1, wherein portions of the first heat slug and the second heat slug are approximately flush with the exterior surface of the semiconductor package.

9. The semiconductor package of claim 1, wherein the first heat slug and the second heat slug are of a first material; and the first die attach clip and the second die attach clip are of a second material.

10. The semiconductor package of claim 6, wherein the material is copper.

11. A semiconductor package, comprising:
a first lead, a second lead, and a die pad;
a first die positioned on the die pad;
a first thermally conductive device coupling the first die to the first lead, the first thermally conductive device having a first surface that is approximately flush with a surface of the semiconductor package;
a second die directly attached to the first thermally conductive device; and
a second thermally conductive device coupling the second die to the second lead, the second thermally conductive device having a second surface that is flush with the surface of the semiconductor package, the second die completely above the first die from a cross-sectional view of the semiconductor package, where a bottom side of the semiconductor package including the die pad is at a bottom in the cross-sectional view; wherein a cross-sectional length of the second die completely aligns with a cross-sectional length of the first die in a vertical direction, the vertical direction perpendicular to a plane along the surface; and wherein the cross-sectional length of the second die is less than the cross-sectional length of the first die.

12. The semiconductor package of claim 11, wherein the first thermally conductive device comprises a heat slug coupled to a die attach clip.

13. The semiconductor package of claim 12, wherein the first thermally conductive device is monolithic.

14. The semiconductor package of claim 11, further comprising a die attach clip positioned between the first die and the first thermally conductive device.

15. The semiconductor package of claim 11, wherein the first and second die are stacked.

16. The semiconductor package of claim 12, wherein the second die is attached to the die attach clip via solder.

17. The semiconductor package of claim 12, wherein the heat slug is coupled to the die attach clip via solder.

* * * * *